(12) United States Patent
Su et al.

(10) Patent No.: US 8,964,452 B2
(45) Date of Patent: Feb. 24, 2015

(54) PROGRAMMABLE RESISTANCE-MODULATED WRITE ASSIST FOR A MEMORY DEVICE

(71) Applicant: Applied Micro Circuits Corporation, Sunnyvale, CA (US)

(72) Inventors: Jason T. Su, Los Altos, CA (US); Bin Liang, Sunnyvale, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 13/726,800

(22) Filed: Dec. 26, 2012

(65) Prior Publication Data

US 2014/0177356 A1    Jun. 26, 2014

(51) Int. Cl.
*G11C 11/00* (2006.01)
*G11C 7/10* (2006.01)
*G11C 11/419* (2006.01)

(52) U.S. Cl.
CPC ............ *G11C 7/1096* (2013.01); *G11C 11/419* (2013.01)
USPC .................. 365/154; 365/189.06; 365/189.16

(58) Field of Classification Search
CPC ............ G11C 7/10; G11C 7/22; G11C 11/41; G11C 11/4125; G11C 11/413; G11C 11/414; G11C 11/416; G11C 11/417; G11C 11/419; G11C 11/56
USPC .......... 365/154, 189.06, 189.16, 189.11, 193, 365/220, 226, 148
See application file for complete search history.

(56) References Cited

U.S. PATENT DOCUMENTS

| | | | |
|---|---|---|---|
| 7,835,217 B1 | 11/2010 | Su et al. | |
| 2003/0210593 A1* | 11/2003 | Selvin et al. | 365/201 |
| 2008/0055967 A1 | 3/2008 | Houston et al. | |
| 2010/0208529 A1* | 8/2010 | Kenkare | 365/189.09 |
| 2011/0141837 A1* | 6/2011 | Prabhat | 365/226 |

* cited by examiner

*Primary Examiner* — David Lam
(74) *Attorney, Agent, or Firm* — Amin, Turocy & Watson, LLP

(57) ABSTRACT

Providing for improved write processes of a semiconductor memory are disclosed herein. By way of example, a programmable write assist can be provided that includes partially discharging a supply voltage applied to a memory cell. Partially discharging the supply voltage can improve write speeds to the memory cell, as well as improve reliability of the write process. A write assist circuit can cause the discharging in response to a resistance-modulated signal. Moreover, the resistance-modulated signal can be configured to control an amount or speed of the discharging of the supply voltage. Further, modulation control can be provided to mitigate discharging of the supply voltage beyond a target level, to reduce data loss in a target data cell or an adjacent data cell.

21 Claims, 10 Drawing Sheets

PROGRAMMABLE RESISTANCE-MODULATED WRITE ASSIST FOR A MEMORY DEVICE

TECHNICAL FIELD

The subject application for patent relates generally to semiconductor memory devices, and more particularly to a programmable resistance-modulated write assist for a memory device.

BACKGROUND

Memory devices have a wide range of uses in electronics and electronic devices. In general, various types of electronic memory exist, including hard disc memory, floppy disc memory, magnetic tape memory, optical disk memory, and so on. One of the more innovative and diversified types of memory is semiconductor memory.

Semiconductor memory operates on the basis of one or more memory transistors. Memory transistors are typically formed in a semiconductor substrate that is moderately to non-electrically conductive, but that can become conductive, or increasingly conductive, when a suitable voltage potential is applied to the transistor. Although various types of memory transistors exist, common memory transistors can store an amount of voltage or charge applied to the transistor, where different amounts of voltage or charge are equated to one (or more) bit(s) of digital information. By measuring electrical conductivity of such a transistor, a state of these bit(s) can be extracted at a later time. In this manner, digital information stored (as an amount of charge or voltage) within the transistor can be read and utilized for data processing. This forms one of the basic mechanisms that computers and related computing devices store and utilize electronic information.

As research and development in semiconductor science progresses, different forms and classifications of semiconductor memory have come to market. One general classification for semiconductor memory is volatile and non-volatile memory. Volatile memory generally requires application of an external voltage to a memory device to maintain a stored charge, or programmed bit. If the external voltage drops below a required level, the stored charge is lost. For a volatile memory device, such as random access memory (RAM), the lost charge results in lost data. Although volatile semiconductor memory has significant advantages, including high program and read speeds, the threat of data loss has made volatile semiconductor memory suitable primarily for RAM applications, especially given non-volatile mass storage alternatives such as hard drives, disc drives, and so on. Non-volatile memory, in contrast, can maintain stored charge without application of an external voltage source. Accordingly, non-volatile memory is not generally subject to data loss in response to power outage, or like occurrences. Non-volatile memory is therefore often utilized for applications in which resistance to power loss is important.

Static random access memory (SRAM) is one type of semiconductor memory generally classified as volatile memory. SRAM is a semiconductor technology that utilizes bi-stable latching circuitry to store a bit. The term "static" differentiates SRAM from dynamic random access memory (DRAM), which must be refreshed. The latching circuit employed by SRAM generally involves multiple transistors. For instance, a six transistor device (6T SRAM) is a common SRAM that stores a bit on four transistors that form two cross-coupled inverters that form a storage cell. The storage cell has two stable states used to denote a 0 or 1 of digital information. Two additional access transistors serve to control access to the storage cell during read and write operations. Other examples of SRAM configuration include 8T, 10T or more transistors per bit.

Generally, the fewer transistors employed for an SRAM cell reduces the size of a cell. The cost of processing a silicon memory device is fixed, in many aspects, and thus employing smaller cells and packing more bits on a wafer can reduce the cost per bit of memory. Cost and size are two factors important to memory design. Other factors include memory stability, read and write times, and so on. Ongoing research in memory technology continues to provide improvements in semiconductor memory technology, leading to more cost effective, and stable digital storage devices.

SUMMARY

The following presents a simplified summary in order to provide a basic understanding of some aspects described herein. This summary is not an extensive overview of the disclosed subject matter. It is intended to neither identify key elements of the disclosure nor delineate the scope thereof. Its sole purpose is to present some concepts in a simplified form as a prelude to the more detailed description that is presented later.

Aspects of the subject disclosure provide for improvements to write processes of a semiconductor memory. Write assist can comprise partially discharging a supply voltage applied to a memory cell to improve write speeds to the memory cell, as well as improve reliability of the write process. In some aspects, the write assist can comprise generating a resistance-modulated signal for partially discharging the supply voltage in conjunction with the write process. Further, modulation control can be provided to mitigate discharging of the supply voltage beyond a target level, to reduce data loss in an adjacent memory cell resulting from excessive discharge of the supply voltage. Write assist as described herein can improve reliability of the write process, as well as improve write speeds for semiconductor memory.

In particular aspects of the subject disclosure, provided is a memory circuit. The memory circuit can comprise a static random access memory (SRAM) bitcell for storing one or more digital bits of information, the SRAM bitcell having a supply node that is powered by a supply voltage. Further, the memory circuit can comprise a supply voltage driver circuit comprising a connection to a source of the supply voltage and comprising a write assist circuit configured to discharge a portion of the supply voltage at the supply node in conjunction with writing a bit to the SRAM bitcell. Moreover, the memory circuit can comprise a programmable control circuit that outputs a resistance modulated write assist signal having a signal characteristic that controls a magnitude of the portion of the supply voltage that is discharged by the write assist circuit.

In additional aspects, provided is a method of operating a semiconductor memory. The method can comprise initiating a write process for a SRAM circuit, and programming a variable resistance circuit to a resistance value related to a supply voltage of the SRAM circuit. Additionally, the method can comprise outputting a resistance-modulated write assist signal and employing the resistance-modulated write assist signal to discharge the supply voltage to ground by a discharge amount related to the resistance value.

According to further aspects, disclosed is a memory circuit. The memory circuit can comprise a voltage source that generates a supply voltage having a magnitude configured to facilitate data retention for a SRAM. The memory cell can further comprise a write assist circuit that partially discharges the supply voltage to ground, lowering the magnitude of the supply voltage at a supply node of the SRAM, and a programmable control circuit that outputs a resistance-modulated signal to control activation of the write assist circuit, the resistance-modulated signal having a signal characteristic that at least in part controls a discharge magnitude by which the magnitude of the supply voltage at the supply node is lowered by the write assist circuit. Moreover, the memory circuit can comprise a modulation circuit that mitigates lowering of the magnitude of the supply voltage at the supply node beyond the discharge magnitude.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
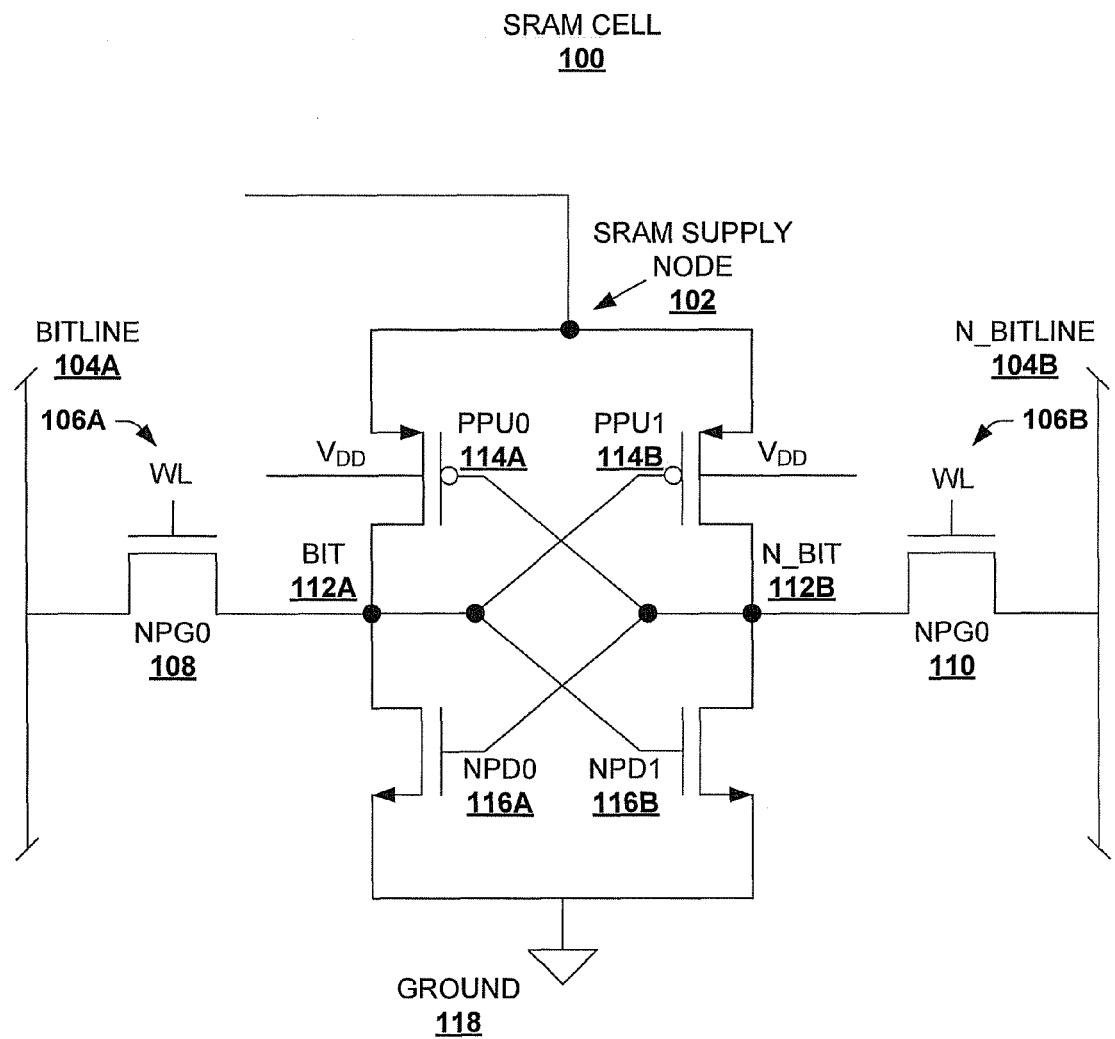
FIG. 1 illustrates a schematic diagram of an example static random access memory (SRAM) according to one or more disclosed aspects.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

As utilized herein, terms "component," "system," and the like are intended to refer to an electronic or computing entity, either hardware, software (e.g., in execution), or firmware. For example, a component can be one or more transistors, memory devices, memory cells, a gate array, a programmable gate array, an application specific integrated circuit, a controller, an arrangement of memory devices, a circuit, data transfer or integration circuitry, an electronic clock, a process running on a processor, a processor, an object, a state machine, a computer, etc. By way of illustration, a circuit, a transistor array electrically connected with the circuit, or a controller that manages data flow between the transistor array and the circuit can be a component. The component can include erasable programming (e.g., process instructions at least in part stored in erasable memory) or hard programming (e.g., process instructions burned into non-erasable memory at manufacture). Furthermore, an apparatus can comprise one or more components that operate together as a system. For instance, the apparatus can comprise an arrangement of electronic hardware, data transfer circuits, logical control circuits, memory circuits that store processing instructions, and a processing circuit that implements the processing instructions in a manner suitable to perform an electronic or computing task.

According to further illustrative examples, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

Various aspects of the subject disclosure provide for resistance-modulated write assist for electronic memory. Resistance-modulated write assist can be applied for instance, in conjunction with programming or writing to a static random access memory (SRAM) cell, or the like. Write assist as described herein can improve write-ability for an electronic memory cell, and therefore performance and manufacturability of electronic devices comprising SRAM.

SRAM is utilized extensively in system-on-chip (SOC) applications, as well as other memory applications. To achieve good area efficiency and power density, SRAM generally comprises transistor devices, such as metal oxide field effect transistors (MOSFETs), with small geometric feature sizes operated at relatively low voltage. Lower voltage, however, can lower write margin of a SRAM cell. Write margin is a metric related to ease with which an SRAM cell can be flipped to a target or desired logic state. Because write margin of a SRAM cell can decrease with lower supply voltage, write margin can be detrimentally impacted by the trend to improve power density. Write margin is related to proper writing of data to a SRAM cell, and thus lower write margin can result in increased likelihood of write failure.

A write failure can occur when write margin of a SRAM cell drops below a level that the SRAM cell can stably maintain. One way to bolster write margin is to increase word line voltage above a power supply voltage for the SRAM cell. However, increasing the word line voltage increases power consumption and can complicate power supply schemes. Another example to bolster write margin is to utilize a switch configured to toggle the power supply of the SRAM cell between two different levels. However, this toggling can be inadequate for high-speed applications because of large resistance-capacitance (RC) constant response times. Toggling can also require additional power supply, reducing cost-effectiveness. Yet another example comprises charge-sharing with diodes that have either a supply voltage or ground clamped at a data-retaining level during write access. This can avoid a need for multiple power supplies, but can increase silicon area for the diodes and increase the size of the SRAM itself. Further, the time to distribute the charge to either lower the supply or raise the local ground can be large, impinging on high-speed applications.

To provide high-speed write processes and maintain cost-effectiveness, memory reliability and small area, aspects of the subject disclosure provide write assist that mitigates or avoids many of the foregoing problems. Write assist can be implemented with a first circuit and a second circuit connected with an array of SRAM cells. The first circuit can be configured to generate a pulse that enables the write assistance during a write access to a SRAM cell. A slope of the pulse can be programmable and can be adjusted to increase or decrease write-ability to a target level. The second circuit can include a driver circuit that generates a supply voltage to the SRAM cells. The second circuit can have an input enabling signal and an active discharging device. Resistance, R, of the active discharging device can determine a slope of the enabling signal, which in turn can determine a discharge amount by which the supply voltage to the SRAM cell is lowered for a write access. The second circuit can further comprise a multiplexer switch that in conjunction with the enabling signal from the first circuit activates the write assistance.

In a particular aspect of the subject disclosure, an NMOS transistor is employed as an active discharge device. Further, a PMOS transistor can be employed as an inhibitor circuit. The inhibitor circuit can hold a supply voltage steady after a target write-assist supply voltage is reached. In still other aspects, the enabling signal can be controlled with a programmable array of pull-up devices with respective resistances. By activating a subset of the array of pull-up devices, the enabling signal can be configured to have one of a set of slopes that correspond with respective ones of the respective resistances. The pull-up devices can be activated or deactivated with respective programming inputs, providing individual control over the pull-up devices of the array.

FIG. 1 illustrates a schematic diagram of an example SRAM cell 100 according to one or more aspects of the subject disclosure. SRAM cell 100 can comprise a SRAM supply node 102. An external supply voltage, or $V_{DD}$, can be applied at SRAM supply node 102 in conjunction with operating SRAM cell 100. Application of various supply voltages at SRAM supply node 102 generally produces different potential across the cross-coupled inverter pairs formed by transistors PPU0 114A, NPD0 116A, PPU1 114B, and NPD1 116B. This variation of potential can be configured to facilitate accessing the stored data reading the bit or modifying the data (writing the bit) at SRAM cell 100.

SRAM cell 100 is further connected to a pair of bitlines, including bitline 104A and N_bitline 104B. A pair of access circuits 106A and 106B facilitate read or write access to a bit(s) stored at SRAM cell 100. Access circuits 106A and 106B comprise respective access transistor 108 and 110, and respective connections to a wordline, WL. Wordline WL can be utilized to activate or deactivate access transistors 108, 110, facilitating access to bit nodes 112A, 112B of SRAM cell 100. In at least one aspect of the subject disclosure, access transistors 108, 110 can comprise NMOS transistors.

Bit nodes 112A, 112B are facilitated by respective pairs of latching circuits. The latching circuits comprise a paired PMOS transistor 114A, 114B and NMOS transistor 116A, 116B. The pair of transistors 114A, 116A comprises a first latching circuit for storing charge at bit node 112A, and the pair of transistors 114B, 116B comprises a second latching circuit for storing charge at bit node 112B. The latching circuits can be configured to operate as is generally known for an SRAM latching cell, where activation and deactivation of the PMOS transistor 114A and NMOS transistor 116A of the first latching circuit are controlled by charge stored at bit node 112B, and activation and deactivation of the PMOS transistor 114B and NMOS transistor 116B of the second latching circuit are controlled by charge stored at bit node 112A.

Writing to or erasing bit nodes 112A, 112B can be accomplished through access transistors 108, 110, respectively. However, the supply voltage at SRAM supply node 102 can have a tendency to inhibit writing to the bit nodes 112A, 112B, proportional to a magnitude of the voltage at SRAM supply node 102. Accordingly, aspects of the subject disclosure provide for a write assist process that can comprise discharging or lowering a portion of the magnitude of the voltage at SRAM supply node 102 to facilitate easier writing to bit nodes 112A, 112B. Such a write assist process can also facilitate reduced write times to bit nodes 112A, 112B, improving write speeds of SRAM cell 100. Additionally, a disclosed circuit for implementing the write assist process can be connected to multiple SRAM cells 100, or multiple arrays of SRAM cells 100 in some disclosed aspects, facilitating improved write access with minimal impact to cell area and chip density (e.g., see FIG. 6, infra).

It should be appreciated that, although FIG. 1 illustrates a 6T SRAM cell, write assist as disclosed herein can be implemented in conjunction with other SRAM cell configurations, and is not limited to the 6T configuration. Moreover, at least some aspects can be applicable to other types of memory cell devices, in which supply voltage impacts write process speed and efficiency. Accordingly, application of disclosed write assist circuits or processes to other memory cells as might be made known to one of ordinary skill in the art by way of the context provided herein is considered within the scope of the subject disclosure.

Figure 2:
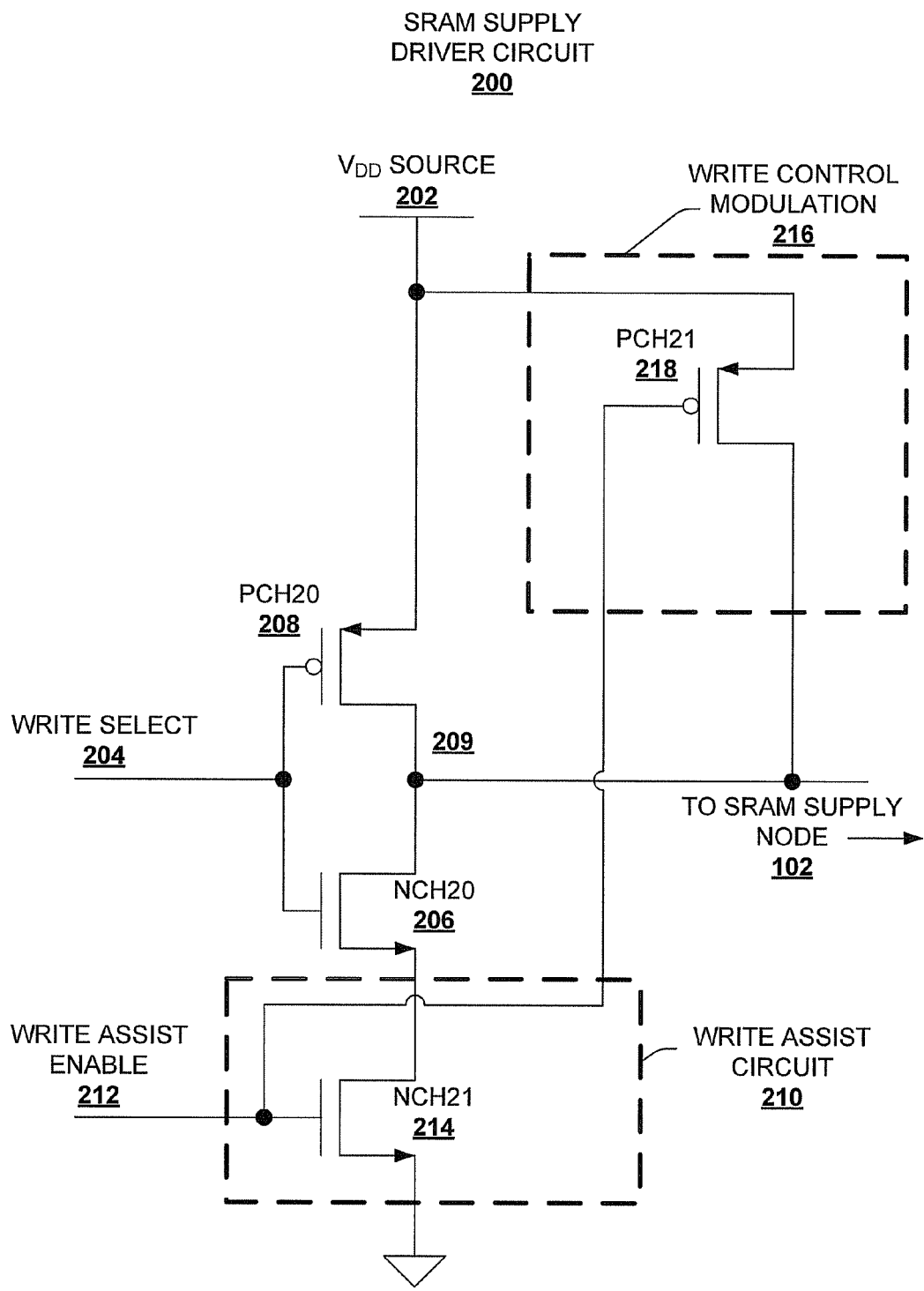
FIG. 2 depicts a schematic diagram of a sample SRAM supply driver circuit for providing write assist for a SRAM, in particular aspects.

FIG. 2 illustrates a schematic diagram of an example SRAM supply driver circuit 200 facilitating write assist for an electronic memory, according to one or more additional aspects of the subject disclosure. SRAM supply driver circuit 200 can comprise a supply voltage source 202, and a selection circuit. The selection circuit can include, for instance, a write select input 204 for selecting a memory cell for a write operation. Application of a suitable voltage at write select input 204 can facilitate selecting or deselecting the memory cell. For instance, a latching circuit comprising a PMOS transistor 208 and NMOS transistor 206 can connect an activation node 209 to supply voltage source 202. Activation node 209 can in turn be connected to a supply node of a memory cell (e.g., SRAM supply node 102 of SRAM cell 100 of FIG. 1, supra). Accordingly, when write select signal 204 connects activation node 209 to supply voltage source 202, the supply voltage can be observed at the SRAM supply node of the memory cell as well.

In addition to the selection circuit, SRAM supply driver circuit 200 can comprise a write assist circuit 210. Write assist circuit 210 can comprise an NMOS transistor 214 that is toggled by a write assist enable input 212. Further, the NMOS transistor 214 can be operated by a write assist signal at the write assist enable input 212 to discharge some or all of a supply voltage charge at activation node 209 to ground. An amount or magnitude of the discharge, also referred to as a discharge voltage amount or discharge amount, can be controlled at least in part by a characteristic of the write assist signal. In at least one aspect, a slope of the write assist signal can control the discharge voltage amount. In another aspect, a peak magnitude of the write assist signal can control the discharge voltage amount. In yet another aspect, a peak to peak frequency can control the discharge voltage amount. In still other aspects, another suitable characteristic, or a suitable combination of the foregoing characteristics can control the discharge voltage amount.

The magnitude of the discharge can be configured for a particular memory cell connected to SRAM supply driver circuit 200. Particularly, the magnitude of the discharge should be sufficient to effectively increase speed or reliability of a write process to the memory cell. In one example, the magnitude of the discharge can be 10% of the supply voltage, although other magnitude can be employed instead, such as 5% of the supply voltage, 15% of the supply voltage, 20%, . . . and so on. In addition, the magnitude of the discharge can be capped to maintain the supply voltage at a minimum level for stably storing a bit, or for neighboring memory cells connected to a common supply voltage node, or common supply voltage line, where suitable, to stably store a bit.

Further to the above, SRAM supply driver circuit 200 can comprise a write control modulation circuit 216. Write control modulation circuit 216 can be configured to inhibit lowering or discharging of supply voltage at activation node 209 (or a supply voltage node of a memory cell) beyond a target discharge voltage amount. Write control modulation circuit 216 can comprise a PMOS transistor that is controlled by a write assist signal at write assist enable input 212. In at least one aspect of the subject disclosure, PMOS transistor 218 can be configured to be activated or deactivated inversely to NMOS transistor 214. For instance, PMOS transistor 218 can be configured to be activated by the write assist enable signal when NMOS transistor 214 of write assist circuit 210 is deactivated, and can be configured to be deactivated by the write assist enable signal when NMOS transistor 214 of write assist circuit 210 is activated. When activated, write control modulation circuit 216 operates to connect supply voltage source 202 to a supply node of a memory cell. In addition, PMOS transistor 218 can be selected to have a particular resistance to provide a predetermined voltage drop of supply voltage source 202. In at least one aspect, the resistance and predetermined voltage drop can match a discharge voltage amount associated with the write assist of write assist circuit 210. Accordingly, when activated, write control modulation circuit 216 can operate to apply the supply voltage minus the discharge voltage amount at the supply voltage node of the memory cell.

As described, write assist circuit 210 and write control modulation circuit 216 can be operated in tandem. In such case, SRAM supply driver circuit 200 can discharge a supply voltage node by a discharge voltage amount (by operation of NMOS transistor 214) and hold or maintain the supply node at a lower voltage that is equal to the supply voltage minus the discharge voltage amount (by operation of PMOS transistor 218). Accordingly, SRAM supply driver circuit 200 can facilitate write assist by lowering charge at activation node 209 thereby lowering the supply voltage, and holding the supply voltage at a lowered level until completion of a write process. This write assist process can improve write times while maintaining relatively low power consumption and relatively low size of a memory cell. As is described in more detail below, an amount of discharge as well as a rate or speed of discharge for the write assist can be controlled by the write assist signal at write assist enable input 212.

Figure 3:
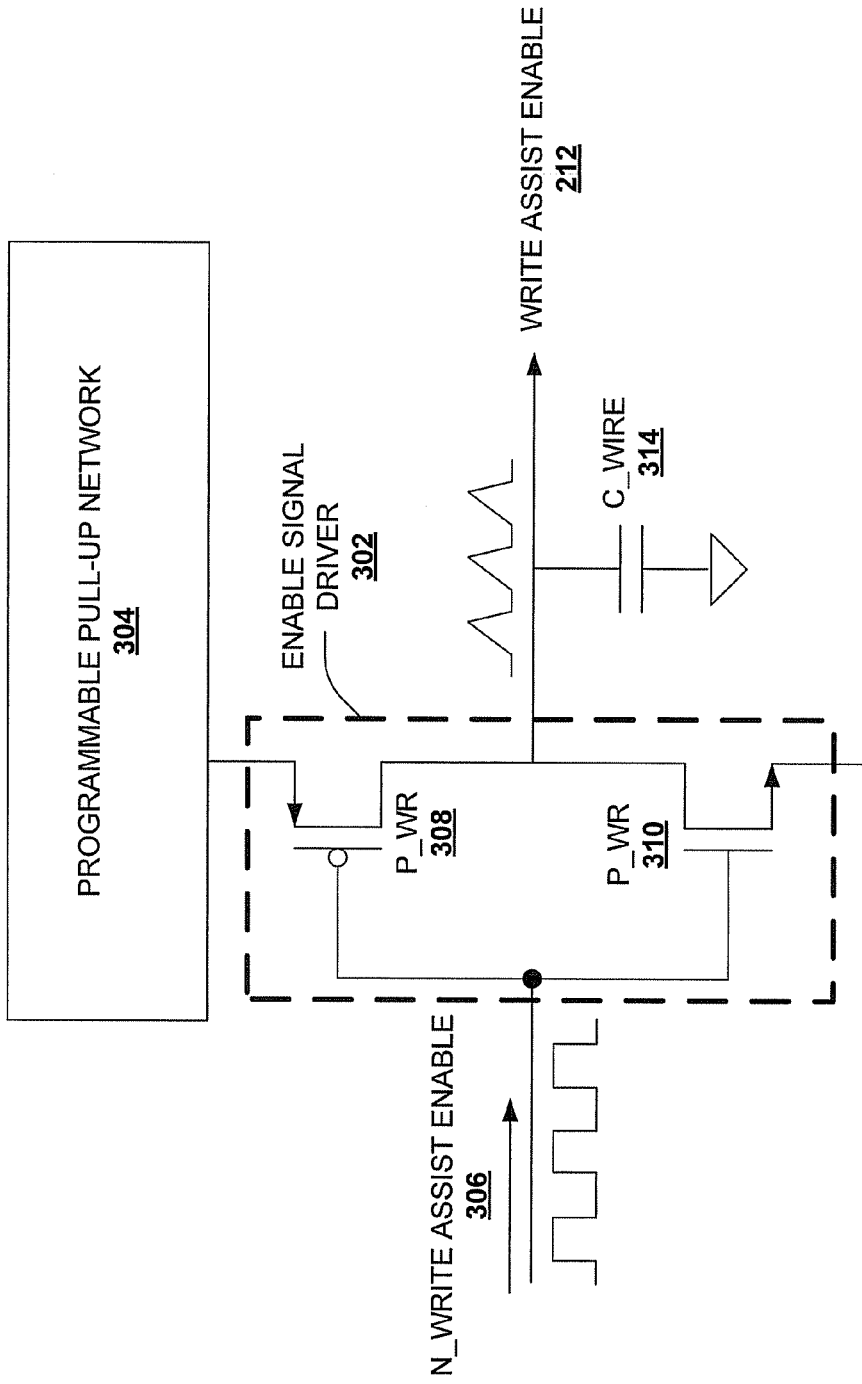
FIG. 3 depicts a schematic diagram of a sample programmable control circuit for resistance-modulation of SRAM write assist, in other aspects.

FIG. 3 depicts a schematic diagram of an example programmable control circuit 300 according to one or more additional aspects of the subject disclosure. Programmable control circuit 300 can be operable to generate and output a write assist enable signal 212 for write assist enable input 212 of FIG. 2, supra, in at least one disclosed aspect. The subject disclosure should not be limited to this aspect, however.

Programmable control circuit 300 can comprise an enable signal driver 302 configured to receive an input write assist enable signal, or N_write assist enable signal 306 as an input. N_write assist enable signal 306 activates and deactivates enable signal driver 302. When activated, enable signal driver 302 generates a write assist enable signal 212 having an increasing slope. When deactivated, enable signal driver 302 ramps down the write assist enable signal 212 to zero (or another suitable base voltage) with a second decreasing slope proportional to a resistance or capacitance 314 (which are constant) of an output wire on which write assist enable signal 212 is output.

A magnitude of the increasing slope of write assist enable signal 212 can be related to a resistance-modulated signal output by a programmable pull-up network 304 (as well as the resistance or capacitance 314 of the output wire). This in turn makes write assist enable signal 212 programmable by programmable pull-up network 304. In at least one aspect of the subject disclosure, programmable pull-up network 304 can be a resistance-modulated network that outputs a resistance-modulated signal to enable signal driver 302 as a function of a programmed resistance of programmable pull-up network 304, and resistance and capacitance 314 of the output wire. This programmed resistance and capacitance 314 and resistance of the output wire can then determine the magnitude of the increasing slope of write assist enable signal 212, in at least one aspect of the subject disclosure. In other aspects, additional characteristics of the write assist enable signal 212 can be controlled at least in part by the programmed resistance (e.g., peak amplitude, peak-to-peak frequency, and so on).

Once generated, write assist enable signal 212 can be output to control operation of a supply driver circuit (e.g., SRAM supply driver circuit 200 of FIG. 2, supra). Thus, in some disclosed aspects, programmable control circuit 300 and SRAM supply driver circuit 200 can operate in conjunction (e.g., see FIG. 5, infra). This configuration provides a fully programmable write assist process for improved write-ability for a memory cell.

Figure 4:
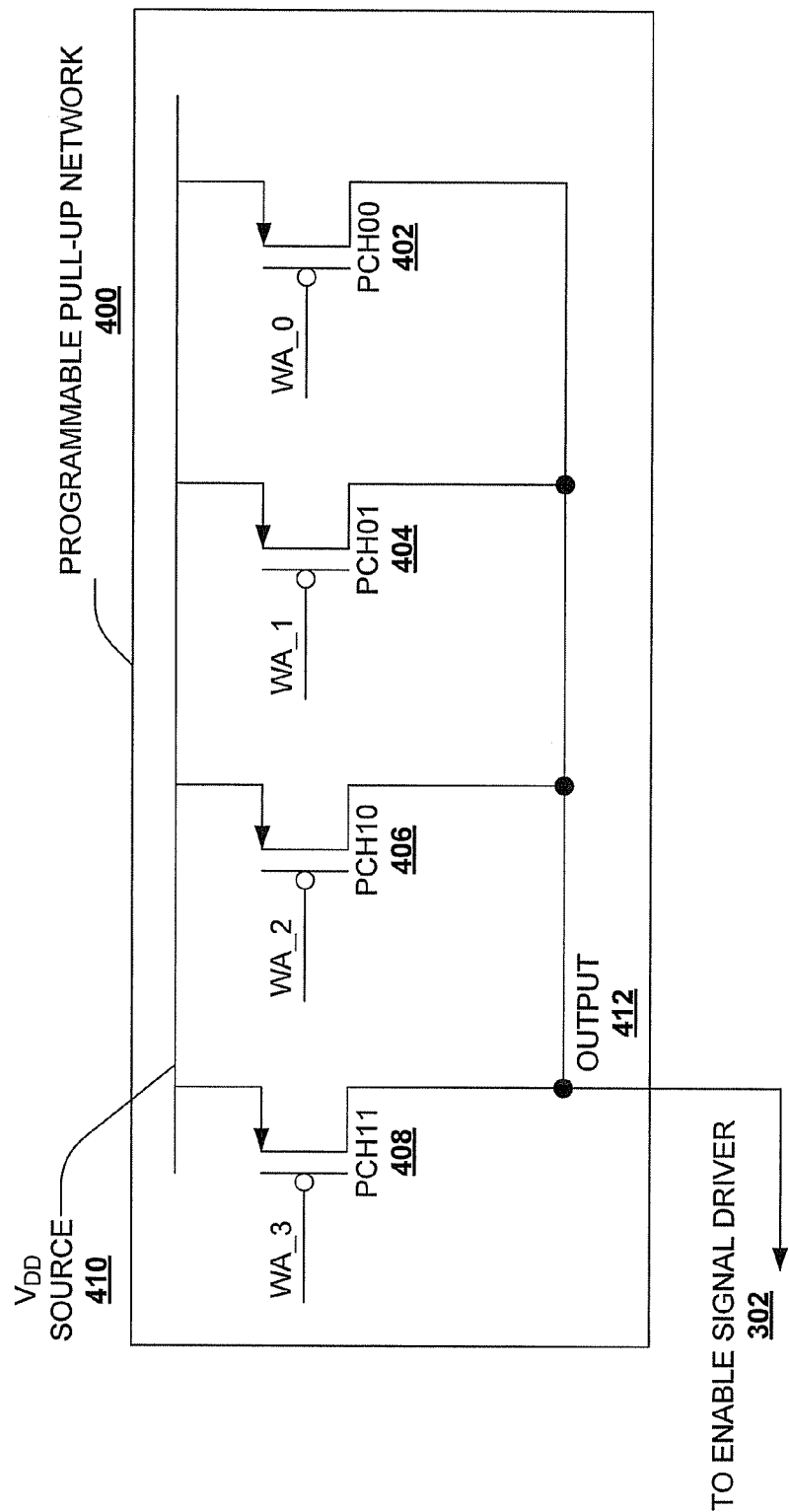
FIG. 4 illustrates a schematic diagram of an example programmable pull-up network according to additional aspects disclosed herein.

FIG. 4 illustrates a schematic diagram of a sample programmable pull-up network 400 according to one or more additional aspects of the subject disclosure. Programmable pull-up network 400 can comprise a set of transistors 402, 404, 406, 408 (referred to collectively as set of transistors 402-408) connected between a $V_{DD}$ source 410 and an output line 412. $V_{DD}$ source 410 can transmit an operation signal for operating a write assist circuit to generate a write assist enable signal, as described herein. The operation signal can be programmably affected by the set of transistors 402-408. Particularly, by activating a subset of set of transistors 402-408, one or more characteristics of the operation signal can be modified and output at output line 412.

Set of transistors 402-408 can comprise a parallel array of PMOS transistors, in one aspect of the subject disclosure. The set of transistors 402-408 can be individually activated or deactivated by respective write access lines, including write access_0 connected to PMOS transistor 402, write access_1 connected to PMOS transistor 404, write access_2 connected to PMOS transistor 406, and write access_3 connected to PMOS transistor 408. It should be appreciated that, although four transistors and write assist lines are depicted by programmable pull-up network 400, other suitable numbers of transistors and write assist lines can be employed for a suitable programmable pull-up network instead. In general, programmable pull-up network 400 can comprise a positive integer number of transistors or write access lines, greater than one (e.g., 2, 3, 4, 5, 6, . . . transistors or write access lines).

Set of transistors 402-408 can be operated to yield one of a set of programmable resistances of programmable pull-up network 400. Particularly, respective ones of set of transistors 402-408 can have a common resistance (e.g., to current flow between $V_{DD}$ source 410 and output line 412) in one aspect of the subject disclosure. Activation of subsets of set of transistors 402-408 can effectively change resistance of programmable pull-up network 400, in increments of the common resistance. In other aspects, one or more of set of transistors 402-408 can be configured to have a different resistance from the common resistance, or all transistors of set of transistors 402-408 can be configured to have different resistances. In either of these cases, programmable pull-up network 400 can be programmed to a greater variety of resistances by activating respective subsets of set of transistors 402-408. This in turn provides significant flexibility over the output signal transmitted to output line 412 and to subsequent circuit components.

Figure 5:
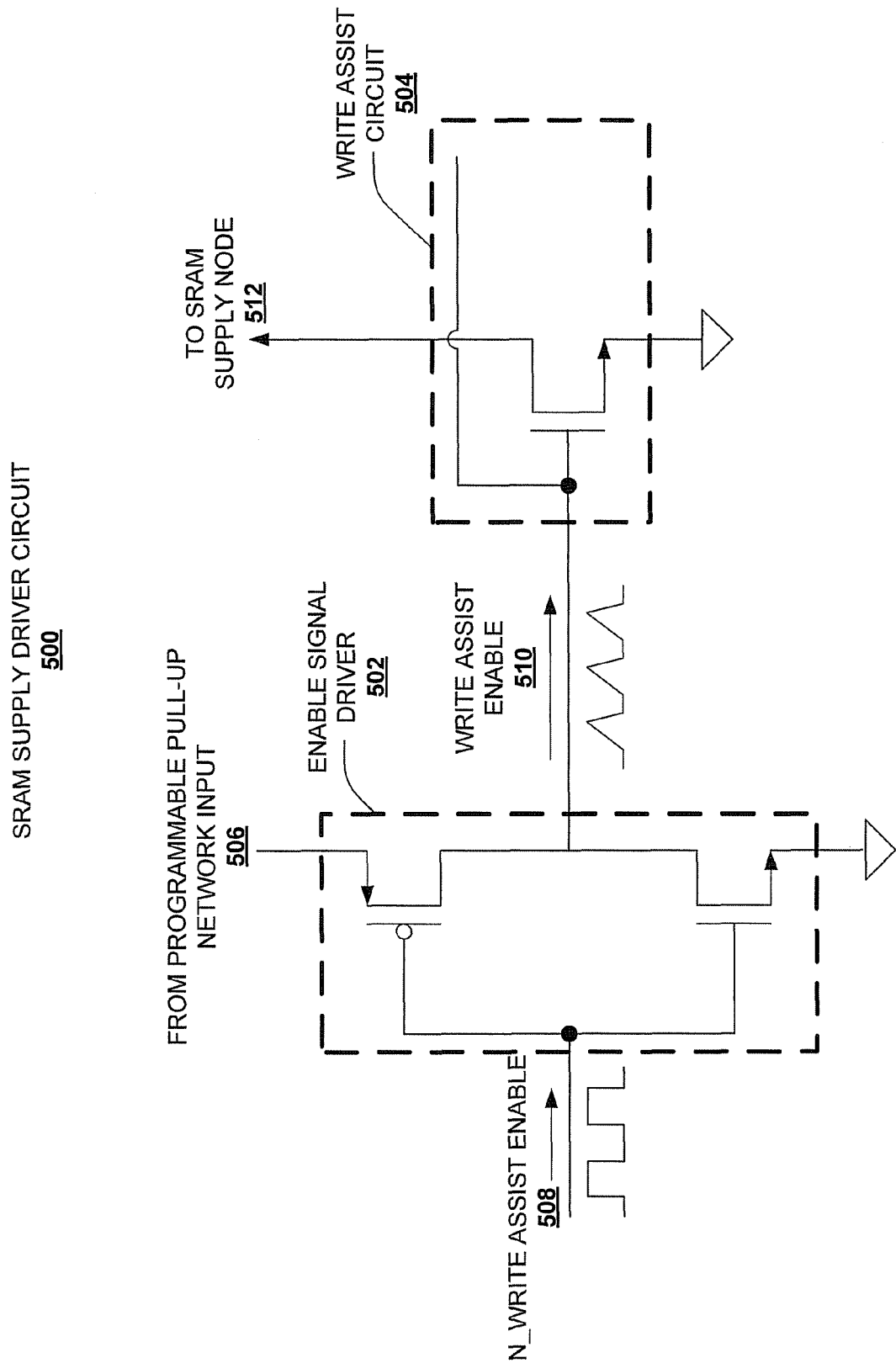
FIG. 5 depicts a schematic diagram of a sample supply voltage driver circuit and a write assist circuit according to other aspects.

FIG. 5 illustrates a schematic diagram of a sample SRAM supply driver circuit 500 according to one or more additional aspects of the subject disclosure. SRAM supply driver circuit 500 can comprise an enable signal driver 502 activated and deactivated by an N_write assist enable input signal 508. In response to activation/deactivation, enable signal driver 502 can generate a write assist enable signal 510 from an input signal 506 provided by a programmable pull-up network. Particularly, input signal 506 can be a resistance-modulated signal configured according to a programmed resistance of the programmable pull-up network.

A write assist enable signal 510 output by enable signal driver 502 can have one or more characteristics controlled by the programmed resistance of the programmable pull-up network. The write assist enable signal 510 is provided to a write assist circuit 504, and activates or deactivates a transistor of write assist circuit 504. (Note that in at least one aspect of the subject disclosure, write assist circuit 504 can be the same as write assist circuit 210 of FIG. 2, supra, and in this aspect(s) write assist enable signal 510 corresponds with write assist enable signal 212, and the transistor activated or deactivated by write assist enable signal 510 is NCH21 transistor 214). The transistor is grounded at one node, and when activated a second node is connected across the transistor to ground. The second node can be connected to a supply node 512 of a memory cell. Accordingly, activation of the transistor serves to drain charge from the supply node 512 of the memory cell, discharging the supply node 512. When the supply node 512 is only partially discharged, write assist circuit 504 can serve to lower a voltage at the supply node 512, and in turn reduce supply voltage inhibitions to accessing the memory cell. This can serve to make a write access (or other operation where suitably applied, such as an erase access, or read access) more reliable (mitigate write failures associated with high supply voltage), make the write access faster to facilitate high-speed memory applications, or like benefits, or suitable combinations thereof.

Figure 6:
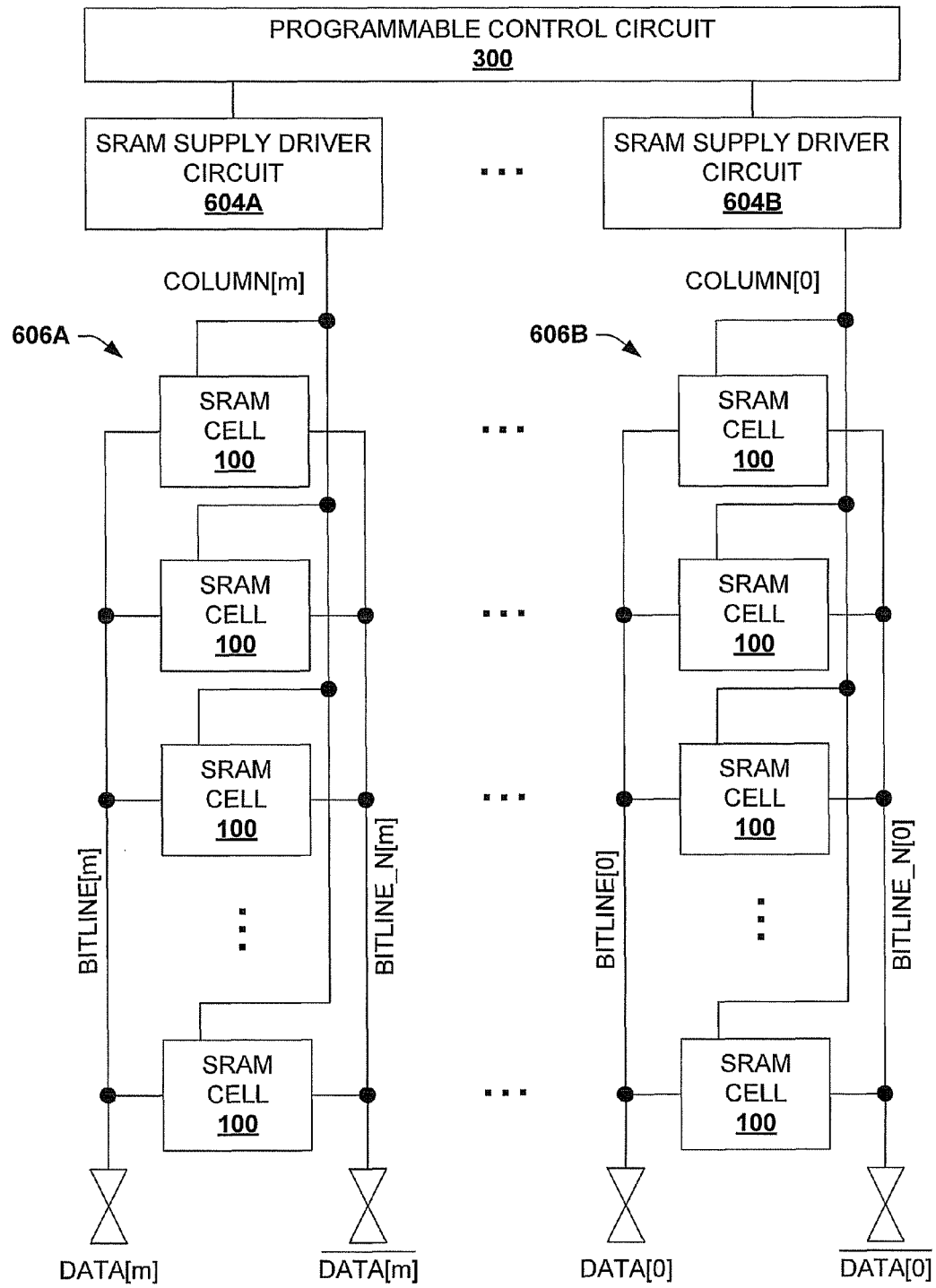
FIG. 6 illustrates a schematic diagram of an example SRAM memory device according to one or more additional aspects of the disclosure.

FIG. 6 illustrates a block diagram of an example memory architecture 600 enabled for programmed write assist according to additional aspects of the subject disclosure. It should be appreciated that memory architecture 600 is but one way of integrating a programmed write assist with an array of memory cells. Other mechanisms or orientations for providing programmed write assist circuitry with an array of memory cells known in the art or made known to one of skill in the art by way of the context provided herein, are considered within the scope of the subject disclosure.

Memory architecture 600 can comprise a programmable control circuit 300. Programmable control circuit can be configured to generate and output a control signal having one or more programmable characteristics. In one or more disclosed aspects, programmable control circuit 300 can be a resistance-modulated programmable control circuit, in which programming comprises selecting one of a set of resistance values of programmable control circuit 300. A selected resistance value can in turn control one or more characteristics of the control signal output by programmable control circuit 300.

A control signal output by programmable control circuit 300 can be provided to one or more SRAM supply driver circuits 604A, 604B (each of which can be the same or similar to SRAM supply driver circuit 200 of FIG. 2, supra). As depicted by memory architecture 600, there is a single SRAM supply driver circuit 604A, 604B per column 606A, 606B of memory devices. However, the subject disclosure need not be limited to this arrangement. In other aspects, a single SRAM supply driver circuit 604A, 604B can be connected to or operable for multiple columns 606A, 606B of memory devices. In still other aspects, multiple SRAM supply driver circuits 604A, 604B can be connected to or operable for a single column 606A, 606B of memory devices or a suitable subset of columns 606A, 606B.

SRAM supply driver circuits 604A, 604B can be configured to receive the output signal generated by programmable control circuit 300. In at least one aspect, activation of a subset of columns 606A, 606B (e.g., one of the columns, . . . ) can be accomplished with a write column select signal (not depicted) generated by memory architecture 600. This write column select signal can also serve to provide the output signal generated by programmable control circuit 300 to a subset of SRAM supply driver circuits 604A, 604B associated with the activated subset of columns 606A, 606B.

Based on a characteristic(s) of the output signal, SRAM supply driver circuit 604A, 604B can partially discharge (e.g., reduce a voltage of) a supply node voltage provided to a column(s) of memory devices 606A, 606B. Particularly, partially discharging the supply node voltage can be implemented in conjunction with a write process for a SRAM cell (e.g., SRAM cell 100) of column 606A or 606B. It should be appreciated that columns 606A, 606B can have any suitable number of memory cells greater than one (e.g., 28 memory cells, 56 memory cells, 128 memory cells, 256 memory cells, . . . ). Moreover, memory architecture 600 can comprise more or fewer columns of such memory cells than depicted.

Figure 7:
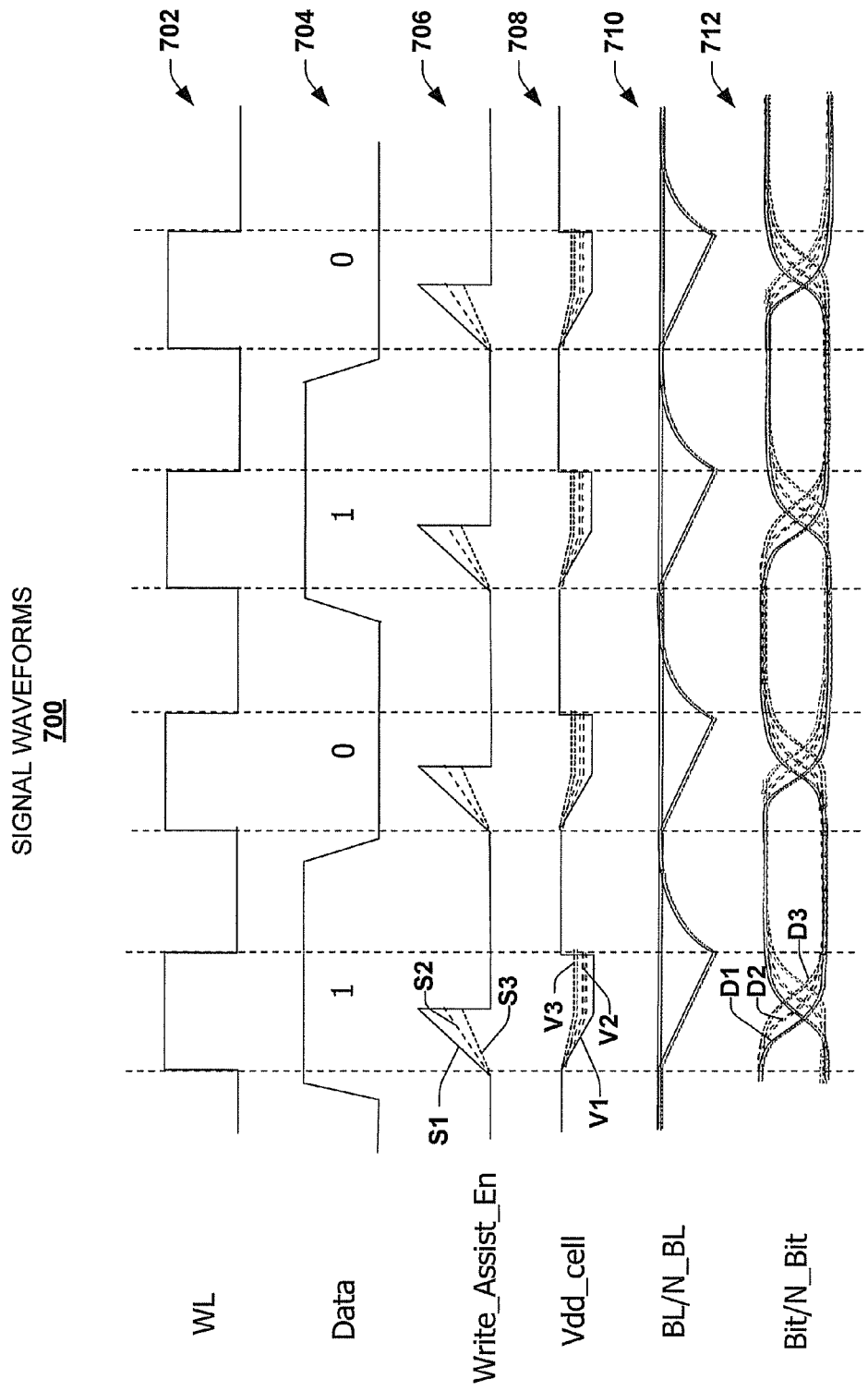
FIG. 7 depicts a diagram of example signal waveforms for providing write assist for an electronic memory, in still other aspects.

FIG. 7 illustrates a diagram of example signal waveforms 700 for a programmable write assist circuit and SRAM cell according to further aspects of the subject disclosure. The SRAM cell can comprise SRAM cell 100 of FIG. 1, in at least one aspect of the subject disclosure. Moreover, the programmable write assist circuit can comprise programmable control circuit 300 of FIG. 3, and SRAM supply driver circuit 200 in additional disclosed aspects. Waveforms 700 are discussed with respect to this configuration of a write assist circuit and SRAM cell. Waveform 702 is a wordline waveform that can be applied at wordlines 106A, 106B of SRAM cell 100. Waveform 700 is a square wave that goes high in alternating clock cycles, as depicted by the vertical dashed lines of waveforms 700. A data waveform 704 represents a signal applied to activate an enable signal driver 302, such as N_write assist enable signal 306. In turn, a write assist enable signal 706 is output by the enable signal driver 302 having one of a set of characteristics. These characteristics are determined by a programmed resistance of a programmable pull-up network 304 (in conjunction with a resistance and capacitance of an output wire, data bus, etc.). As depicted, waveform 706 can include a high slope waveform S1, medium slope waveform S2 or low slope waveform S3, as illustrative examples, depending on a programmed resistance of the programmable pull-up network 304. In other aspects, different characteristics of waveforms 706 can be affected by the programmed resistance, in addition to or in lieu of the slope.

The write assist enable waveforms 706 are output by the enable signal driver 302 to a write assist circuit 210. The write assist circuit 210 causes a discharging (e.g., a decrease) of a supply voltage waveform 708, as depicted. The largest decrease in supply voltage corresponds with waveform V1, caused by write assist enable signal S1. A medium decrease corresponds with waveform V2 caused by waveform S2, and a low decrease of waveform V3 corresponds with write assist enable waveform S3. Note that the drop in supply voltage terminates when write assist enable waveform 706 drops to zero, and a write control modulation circuit 216 holds the supply voltage at a constant value for a remainder of the clock cycle.

Waveforms 710 and 712 reflect voltages at a pair of bitlines 104A, 104B of SRAM cell 100 and at bit nodes 112A, 112B, respectively. Note that the signal for bitline 104A and N_bitline 104B are substantially equivalent. In contrast, waveforms at bit node 112A and N_bit node 112B are substantially opposite in magnitude. Moreover, note that waveforms 712 at bit nodes 112A, 112B change at different rates corresponding with slopes of waveforms S1, S2, S3 and V1, V2, V3. Particularly, a highest program speed corresponds with waveform D1 caused by write assist enable signal S1. Likewise, a medium program speed of waveform D2 is caused by write assist enable signal S2, and a relatively slow program speed of waveform D3 is caused by write assist enable signal S3. Accordingly, by programming the programmable pull-up network 304, different write speeds can be generated, for facilitating high-speed applications, or lower speed applications as suitable.

The aforementioned diagrams have been described with respect to interaction between several components, circuits, or systems. It should be appreciated that such diagrams can include those components, circuits and systems specified therein, some of the specified components/circuits/systems, or additional components/circuits/systems. For example, a system could include an integrated chip comprising a SRAM cell 100, an SRAM supply driver circuit 200, and a programmable control circuit 300 comprising a programmable pull-up network 400. Sub-components could also be implemented as electrically connected to other sub-components rather than included within a parent architecture. Additionally, it should be noted that one or more disclosed processes could be combined into a single process providing aggregate functionality. Components of the disclosed architectures can also interact with one or more other components not specifically described herein but known by those of skill in the art.

Figure 8:
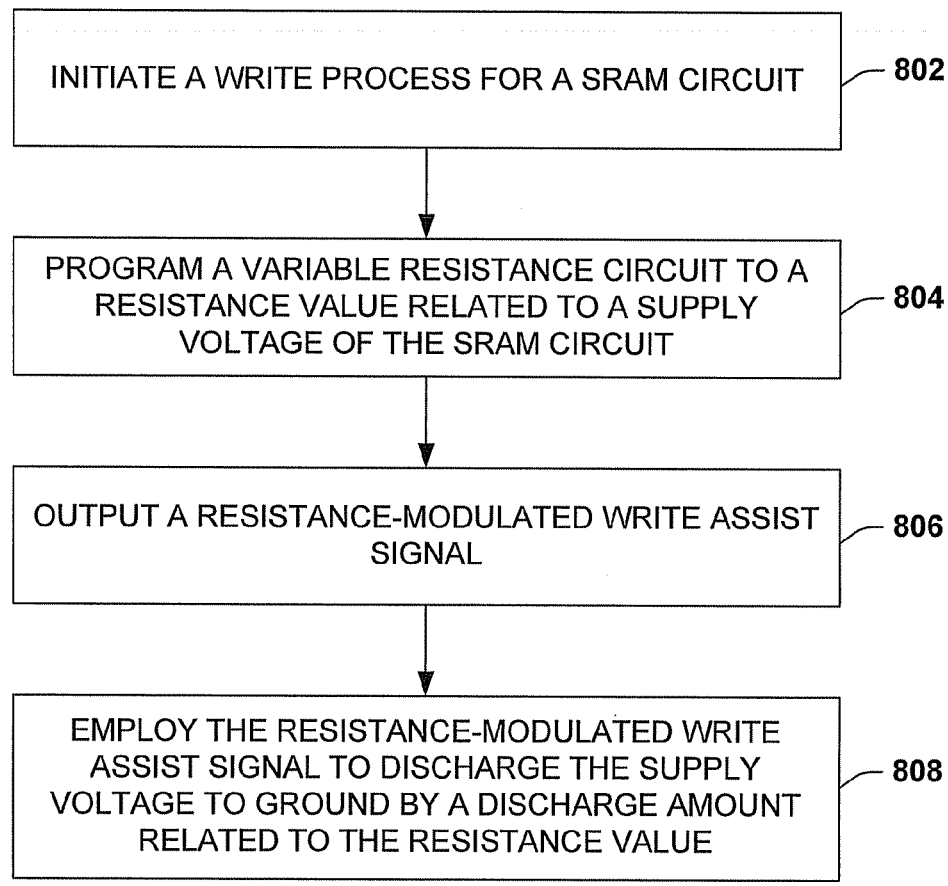
FIG. 8 depicts a flowchart of an example method for providing resistance-modulated write assist for an electronic memory, in further aspects.
Figure 9:
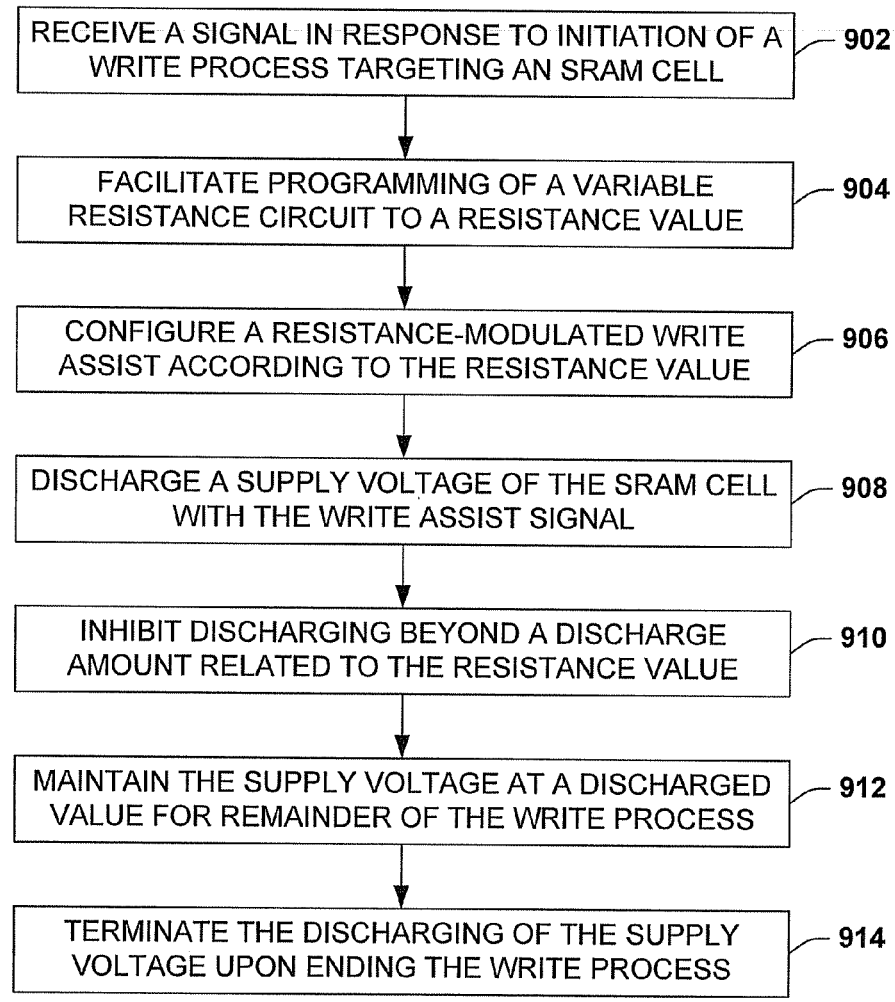
FIG. 9 illustrates a flowchart of a sample method for providing resistance-modulated write assist with supply voltage stabilization, in an aspect.

In view of the exemplary diagrams described supra, process methods that can be implemented in accordance with the disclosed subject matter will be better appreciated with reference to the flow charts of FIGS. 8 and 9. While for purposes of simplicity of explanation, the methods 800, 900 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 800, 900 described hereinafter. Additionally, it should be further appreciated that the methods 800, 900 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 8 illustrates a flowchart of an example method 800 for providing programmable write assist for semiconductor memory, according to one or more additional aspects of the subject disclosure. At 802, method 800 can comprise initiating a write process for a SRAM circuit. Alternatively, method 800 can comprise receiving a signal indicative of initiation of the write process for the SRAM circuit. At 804, method 800 can comprise programming a variable resistance circuit to a resistance value related to a supply voltage of the SRAM circuit. Particularly, the resistance value can be programmed to a level corresponding with a target reduction in the supply voltage of the SRAM circuit. At 806, method 800 can comprise outputting a resistance-modulated write assist signal in response to the programming the variable resistance circuit. At 808, method 800 can comprise employing the resistance-modulated write assist signal to discharge the supply voltage to ground by a discharge amount related to the resistance value. Method 800 can be operable, in at least one aspect, to employ the resistance-modulated write assist signal to discharge the supply voltage in two stages, a lowering stage that discharges the supply voltage by the amount, followed by a retaining stage that maintains the supply voltage at a lowered amount.

FIG. 9 depicts a flowchart of an example method 900 according to one or more additional aspects of the subject disclosure. At 902, method 900 can comprise receiving a signal in response to initiation of a write process targeting an SRAM cell. At 904, method 900 can comprise facilitating programming of a variable resistance circuit to a resistance value. At 906, method 900 can comprise configuring a resistance-modulated write assist according to the resistance value. At 908, method 900 can comprise discharging a supply voltage of the SRAM cell with the write assist signal, and at 910, method 900 can comprise inhibiting discharging the supply voltage beyond a discharge amount related to the resistance value. At 912, method 900 can comprise maintaining the supply voltage at a discharged value for a remainder of the write process. At 914, method 900 can comprise terminating the discharging of the supply voltage upon ending the write process.

Figure 10:
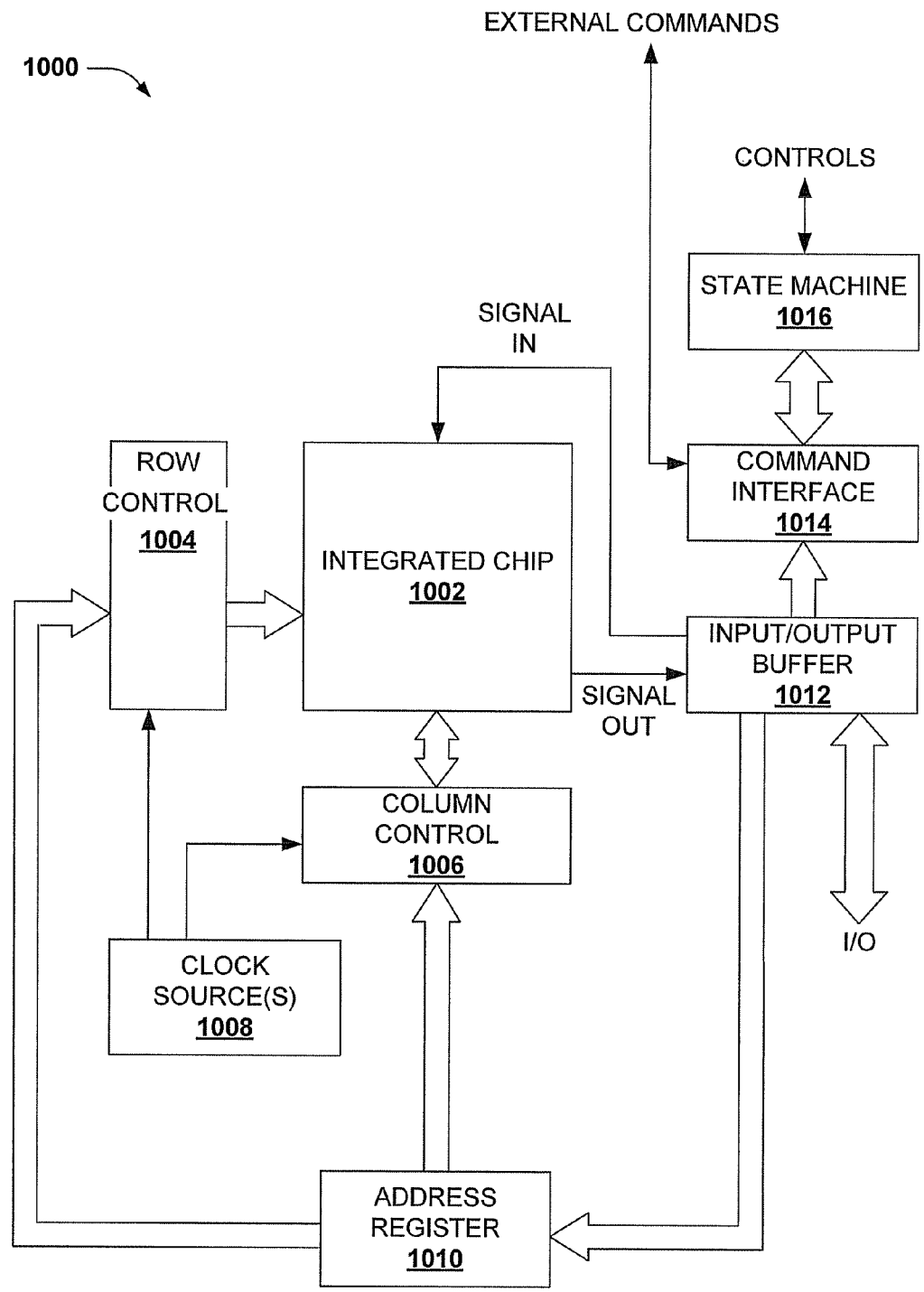
FIG. 10 depicts a block diagram of an example operating environment for electronic memory according to various disclosed aspects.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of digital electronic components and process methodologies for operating such components, those skilled in the art will recognize that the subject disclosure also can be implemented in combination with other digital or analog electronic components or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject disclosure can be practiced on stand-alone electronic devices, such as a memory card, Flash memory module, removable memory, or the like. In a distributed computing environment, program modules can be located in both local and remote memory storage modules or devices.

FIG. 10 illustrates a block diagram of an example operating and control environment 1000 for an integrated chip 1002 according to aspects of the subject disclosure. In at least one disclosed aspect, integrated chip 1002 can comprise a variety of SRAM memory cell technology. Particularly, integrated chip 1002 can be arranged to facilitate programmable resistance-modulated write assist for memory cells of integrated chip 1002, as described herein. It should be appreciated that control environment 1000 is only one example of interfacing with and controlling integrated chip 1000, and is not intended to limit the scope of the subject disclosure. Rather, other mechanisms, systems or architectures for control and communication with an integrated chip known in the art or made known to one of skill in the art by way of the context provided herein, are considered part of the subject disclosure.

A column controller 1006 can be formed adjacent to integrated chip 1002. Moreover, column controller 1006 can be electrically coupled with a first set of data or control lines (e.g., bit lines, ...) of integrated chip 1002. Column controller 1006 can control respective ones of the first set of data or control lines, facilitating operation of one or more functions of integrated chip 1002, providing program information for programmable portions of integrated chip 1002, or the like.

In addition, operating and control environment 1000 can comprise a row controller 1004. Row controller 1004 can be formed adjacent to column controller 1006, and electrically connected with a second set of data or control lines (e.g., word lines, ...) of integrated chip 1002. Row controller 1004 can select or activate subsets of the second set of data or control lines to further facilitate operation of integrated chip 1002. Thus, row controller 1004 can operate alone or in conjunction with column controller 1006 to facilitate operation of the one or more functions of integrated chip 1002.

A clock source(s) 1008 can provide respective clock pulses to facilitate timing for operations of row control 1004 and column control 1006. Clock source(s) 1008 can further facilitate selection of subsets of the first set of control lines and the second set of control lines in response to external or internal commands received by operating and control environment 1000. An input/output buffer 1012 can be connected to an external host apparatus, such as a computer or other processing device (not depicted) by way of an I/O buffer or other I/O communication interface. In addition, input data can be transmitted to integrated chip 1002 via signal input lines, and output data can be received from integrated chip 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of integrated chip 1002. State machine 1016 receives commands from the host apparatus via input/output interface 1012 and command interface 1014, and manages read, write, erase, data input, data output, and like functionality associated with integrated chip 1002. In some aspects, state machine 1016 can send and receive acknowledgments and negative acknowledgments regarding successful receipt or execution of various commands.

To implement functionality of integrated chip 1002, state machine 1016 can control clock source(s) 1008. Control of clock source(s) 1008 can cause output pulses configured to facilitate row controller 1004 and column controller 1006 implementing the particular functionality. Output pulses can be transferred to selected subsets of the first set of data or control lines by column controller 1006, for instance, or to selected subsets of the second set of data or control lines by row controller 904, for instance.

Various aspects of the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips ... ), optical disks (e.g., compact disk (CD), digital versatile disk (DVD) ... ), smart cards, and flash memory devices (e.g., card, stick, key drive ... ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory circuit, comprising:
    a static random access memory (SRAM) bitcell for storing one or more digital bits of information, the SRAM bitcell having a supply node that is powered by a supply voltage;
    an SRAM supply driver circuit comprising a connection to a source of the supply voltage and comprising a write assist circuit configured to discharge a portion of the supply voltage at the supply node in conjunction with writing a bit to the SRAM bitcell; and
    a programmable control circuit that outputs a resistance modulated write assist signal having a signal characteristic that controls a magnitude of the portion of the supply voltage that is discharged by the write assist circuit.

2. The memory circuit of claim 1, the SRAM supply driver circuit further comprising a write control modulation circuit comprising a PMOS transistor connected at one diffusion terminal to the source of the supply voltage, and at a second diffusion terminal to a source node of the SRAM bitcell.

3. The memory circuit of claim 2, wherein the PMOS transistor comprises a gate terminal connected to either the resistance modulated write assist signal or to a write column select signal of the memory circuit.

4. The memory circuit of claim 2, wherein the write control modulation circuit is configured to mitigate a decrease in the supply voltage greater than the portion of the supply voltage, in response to the resistance modulated write assist signal activating the write control modulation circuit and deactivating write assist circuit.

5. The memory circuit of claim 1, wherein the write assist circuit further comprises an active pull-down device connected to ground and to the supply node, the active pull-down device is activated or deactivated by the resistance modulated write assist signal.

6. The memory circuit of claim 5, the active pull-down device is configured to discharge the portion of the supply voltage at the supply node to ground in response to being activated by the resistance modulated write assist signal, and is configured to terminate discharging of the portion of the supply voltage in response to being deactivated by the resistance modulated write assist signal.

7. The memory circuit of claim 1, the programmable control circuit outputs the resistance modulated write assist signal in two phases, a first phase that implements discharging the portion of the supply voltage, and a second phase that maintains the supply voltage at a substantially constant magnitude following the discharging of the portion of the supply voltage.

8. The memory circuit of claim 1, the programmable control circuit further comprises a programmable network having a variable resistance.

9. The memory circuit of claim 8, wherein the signal characteristic is proportionate to a value of the variable resistance.

10. The memory circuit of claim 9, wherein the signal characteristic is slope, magnitude, or frequency of the resistance modulated write assist signal.

11. The memory circuit of claim 8, the programmable control circuit further comprising a signal output circuit that generates the resistance modulated write assist signal in response to an input square wave signal and a value of the variable resistance.

12. The memory circuit of claim 8, the programmable network comprising an array of independently controlled PMOS transistors, the programmable network is configured to have one of a set of discrete values of the variable resistance in response to activation of a corresponding subset of the PMOS transistors.

13. The memory circuit of claim 12, the signal output circuit outputs the resistance modulated write assist signal with one of a set of discrete slopes in response to the programmable network being programmed to the one of the set of discrete values of the variable resistance.

14. The memory circuit of claim 13, the write assist circuit discharges the supply voltage by one of a set of discrete voltages, the set including the portion of the supply voltage, in response to the modulated write assist signal having the one of the set of discrete slopes.

15. A method of operating a semiconductor memory, comprising:
   initiate a write process for a static random access memory (SRAM) circuit;
   program a variable resistance circuit to a resistance value related to a supply voltage of the SRAM circuit;
   output a resistance-modulated write assist signal; and
   employ the resistance-modulated write assist signal to discharge the supply voltage to ground by a discharge amount related to the resistance value; and
   employ the resistance-modulated write assist signal to control a modulation circuit that pulls up the supply voltage from a discharged voltage value to a supply source voltage.

16. The method of claim 15, further comprising inhibiting discharge of the supply voltage beyond the discharge amount.

17. The method of claim 16, further comprising holding the supply voltage at a substantially constant, reduced voltage following discharging of the supply voltage.

18. The method of claim 15, further comprising terminating the discharging of the supply voltage following completion of the write process.

19. The method of claim 15, further comprising determining a value of the discharge amount at least in part from a value of the supply voltage, and determining the resistance value from the amount of supply voltage discharge.

20. A memory circuit, comprising:
   a voltage source that generates a supply voltage having a magnitude configured to facilitate data retention for a state static random access memory (SRAM);
   a write assist circuit that partially discharges the supply voltage to ground, lowering the magnitude of the supply voltage at a supply node of the SRAM;
   a programmable control circuit that outputs a resistance-modulated signal to control activation of the write assist circuit, the resistance-modulated signal having a signal characteristic that at least in part controls a discharge magnitude by which the magnitude of the supply voltage at the supply node is lowered by the write assist circuit; and
   a modulation circuit, activated or deactivated by the resistance-modulated signal, that mitigates lowering of the magnitude of the supply voltage at the supply node beyond the discharge magnitude.

21. The memory circuit of claim 20, the programmable control circuit further comprising an array of transistors that can be respectively activated by respective program control signals, wherein activation of respective subsets of the transistors corresponds with respective ones of a set of discrete resistance values of the programmable control circuit.

* * * * *